United States Patent [19]
Kelly

[11] Patent Number: 5,969,354
[45] Date of Patent: *Oct. 19, 1999

[54] ELECTRON ANALYZER WITH INTEGRATED OPTICS

[76] Inventor: Michael A. Kelly, 35 Lerida Ct., Portola Valley, Calif. 94028

[*] Notice: This patent is subject to a terminal disclaimer.

[21] Appl. No.: 08/987,325

[22] Filed: Dec. 9, 1997

[51] Int. Cl.[6] ...................................................... H01J 49/46
[52] U.S. Cl. .................................. 250/305; 250/396 ML
[58] Field of Search ............................ 250/305, 396 ML

[56] References Cited

U.S. PATENT DOCUMENTS

| | | | |
|---|---|---|---|
| 3,822,382 | 7/1974 | Koike | 250/305 |
| 5,583,336 | 12/1996 | Kelly | 250/305 |

OTHER PUBLICATIONS

Kim et al., "Construction of a new imaging bandpass analyzer for a magnetic projection photoelectron microscope," *Review of Scientific Instruments*, vol. 65, No. 5, May 1993, pp. 3159–3167.

*Primary Examiner*—Jack I. Berman
*Attorney, Agent, or Firm*—Charles S. Guenzer

[57] ABSTRACT

A charged-particle analyzer in which a solenoid or other means set up a generally axial magnetic field in a drift region. Meshes of magnetically permeable material are set at ends of the drift region to terminate the magnetic field. Charged particles, such as electrons, are incident upon entrance mesh at a given angle with respect to the central axis. After passing through the entrance mesh, they gyrate around the magnetic field lines, and they then exit the drift region through the exit mesh. The rotation accumulated across the drift region depends upon the energy of the incident particle, and the angle of the particle trajectory exterior of the exit mesh thus depends on the particle's energy. A charged-particle detector detects the position of the particle relative to the central axis and, hence, its energy. In one embodiment, the meshes are flat so that a uniform magnetic field is created in the drift region. In another embodiment, the meshes are curved and may act as charged-particle lenses with focal planes at the particle source and at the detector.

30 Claims, 3 Drawing Sheets

ELECTRON ANALYZER WITH INTEGRATED OPTICS

FIELD OF THE INVENTION

The invention relates generally to devices for separating electrons or other charged particles according to their energies. Specifically, the present invention relates to a real-time analysis of the energy distribution of such charged particles.

BACKGROUND ART

Electron energy analyzers are essential components of a number of electron devices, most particularly analytical instruments which determine the composition and properties of materials based upon the energy distribution of electrons emitted from the surface of the material being tested when that surface is appropriately stimulated. Two widely used instruments which utilize electron energy analyzers are X-ray photoelectron spectrometers (XPS) and Auger electron spectrometers (AES). In these systems, the instrument's resolution, which is the ability to distinguish different elements and chemical bonds in the material being analyzed, and its sensitivity, which is the minimum detectable level of these constituents, are largely determined by the electron energy analyzer. To be useful in these applications, an electron energy analyzer must be able to distinguish electrons of energies on the order of 1000 electron volts (eV) which differ in energy by 1 eV.

For a high-throughput machine, it is desirable that a wide energy range be simultaneously measured with the above resolution. That is, the electron energy spectrum should be produced in real time without scanning the analyzer with respect to the energies. This allows the analyzer to capture all electrons emitted from the surface with the energy range of interest.

In U.S. Pat. No. 5,583,336, issued Dec. 10, 1996, incorporated herein by reference in its entirety, I described such a high-throughput analyzer, as illustrated in side schematic view in FIG. 1. A material 10 being tested is placed in an evacuated region and is stimulated by the appropriate means at a point 12 on its surface. Electrons are emitted from that point 12 in a diverging beam 14 having a distribution dependent upon the nature of the probe and the type of material. A charged-particle lens 16 collimates the beam 14 into a substantially parallel beam 18 inclined at an angle θ with respect to an axis 20. Preferably, the angle θ is about 20°, but is necessarily greater than 0° and less than 90°. The lens 16 may be of various types, such as electrostatic or magnetic, as is well known in the art.

The collimated beam 18 enters an energy separator 22 supported within a tube 24 extending along the axis 16. Included within the tube 24 is a solenoid 26, also extending along the tube 24. The ends of the tube 24 are covered with respective meshes 28, 30 composed of a magnetically permeable material such as an iron-nickel alloy. These materials are usually electrically conductive as well. The meshes are open enough to pass a substantial fraction of the electrons incident upon them. However, they are composed of a highly magnetically permeable material that acts to terminate magnetic field lines incident upon the material. Thus, a mesh composed of highly magnetically permeable material makes the mesh impermeable to a magnetic field perpendicular to the plane of the mesh. When the solenoid 26 is generating an axial magnetic field B within the tube 24, the magnetic meshes act as a magnetic shunt preventing the axial field from passing further outwardly along the axis. Preferably, the tube 24 is made of a magnetic material so that the magnetic field is shunted by the magnetic meshes 28, 30 and the magnetic tube 24 around the back side of the solenoid 26. That is, the meshes 28, 30 and tube 24 act as a magnetic circuit between the ends of the solenoid 26. Because of this construction, a current, typically DC, applied to the coil 26, produces a uniform axis magnetic field B within a drift region 32 of the energy separator 22. Preferably, no electric field exists in the drift region 32, as may be accomplished by electrically grounding the entrance and exit meshes 28, 30 and by positioning an unillustrated Faraday shield positioned inside the coil 24.

The collimated electron beam 18 enters the uniform-field drift region 32 at the angle θ with respect to the magnetic field B. As a result, the electrons in the beam 18 begin to execute a helical trajectory 32 about the magnetic field B and the axis 20. As is well known, the amount of rotation after a distance d is given by $$\phi = \frac{\sqrt{2}\,eBd}{\sqrt{Em}}\cos\theta, \tag{1}$$

where e is the charge of the particle, m is its mass, and E is its energy. Hence, the rotation φ accumulated over the length of the uniform-field central region 32 depends on the particle's energy E.

After the particles have traversed the uniform-field drift region 32, they exit through the magnetically field terminating exit mesh 30. At that point, the helical motion stops, and the particle again begins traveling in a linear trajectory 36 at the angle θ with respect to the axis 20. However, due to the rotation, the azimuthal angle (into and out of the illustrated plane) will vary depending upon the particle's energy. The result in the far field, with no further processing, would be a circular pattern with the particle's position on the circle indicating its energy. However, it is preferred to include another grid 38 biased with respect to the exit mesh 30 so as to create a uniform electric field 40 between the exit grid 30 and the electrostatic grid 38. Assuming an accelerating electric field 48, the angle of the particle's trajectory 50 is reduced from θ to θ', but the amount of reduction depends on the particle's energy, as is defined in the equation $$\theta' = \cos^{-1}\sqrt{\frac{\cos^2\theta + \frac{eV_B}{E}}{1 + \frac{eV_B}{E}}}, \tag{2}$$

where $V_B$ is the bias voltage applied to the electrostatic grid 38 relative to the exit mesh 30. An electrostatic lens 52 focuses the particles on the plane of a detector 54. Assuming the illustrated direction of the trajectories 50, the beams are focused a distance R' off the central axis 20 of the separator 22.

However, if the detector 54 is viewed along the central axis 20, as illustrated in FIG. 2, the locus 56 of the detected particles follows a spiral pattern from a low-energy end 58 to a high-energy end 60. The additional acceleration provided by the bias grid 38 prevents any overlapping between particles having energies that have rotation angles differing by 2π or a multiple thereof.

If particle detectors are placed along the locus 56, the number of particles detected by each detector provides a count of the number of particles having the corresponding energy.

Although the analyzer of FIG. 1 offers high performance with relatively few parts, it is still desired to reduce its complexity and increase its functionality.

SUMMARY OF THE INVENTION

A charged-particle analyzer, especially for electrons, having a drift chamber with a generally axial magnetic field into which the charged particles enter at an entrance angle with respect to the magnetic field lines. The magnetic field causes the charged particles to execute a helical trajectory about the magnetic field lines with the amount of rotation dependent upon the energy of the incident charged particle. When the charged particles exit the drift chamber, the exit angle equals in magnitude the entrance angle, but the rotation introduces an energy-dependent azimuthal component. A charged-particle detector array detects the azimuthal component of the exit trajectory. In a simple embodiment, a planar magnetic mesh terminates the axial magnetic field. However, the mesh can be curved and can thereby serve other purposes, such as focusing the entrance or exit beam. To prevent the azimuthal degeneracy possible with particles having a wide energy band, an additional energy is imparted to the charged particle introducing a variation of the entrance or exit angle dependent upon the original energy, thereby forming a spiral locus of particles as a function of energy. The extra energy can be provided by accelerating or decelerating grids at the entrance or exit meshes or by biasing the entrance and exit meshes with respect to each other.

DETAILED DESCRIPTION OF THE PREFERRED EMBODIMENTS

Figure 1:
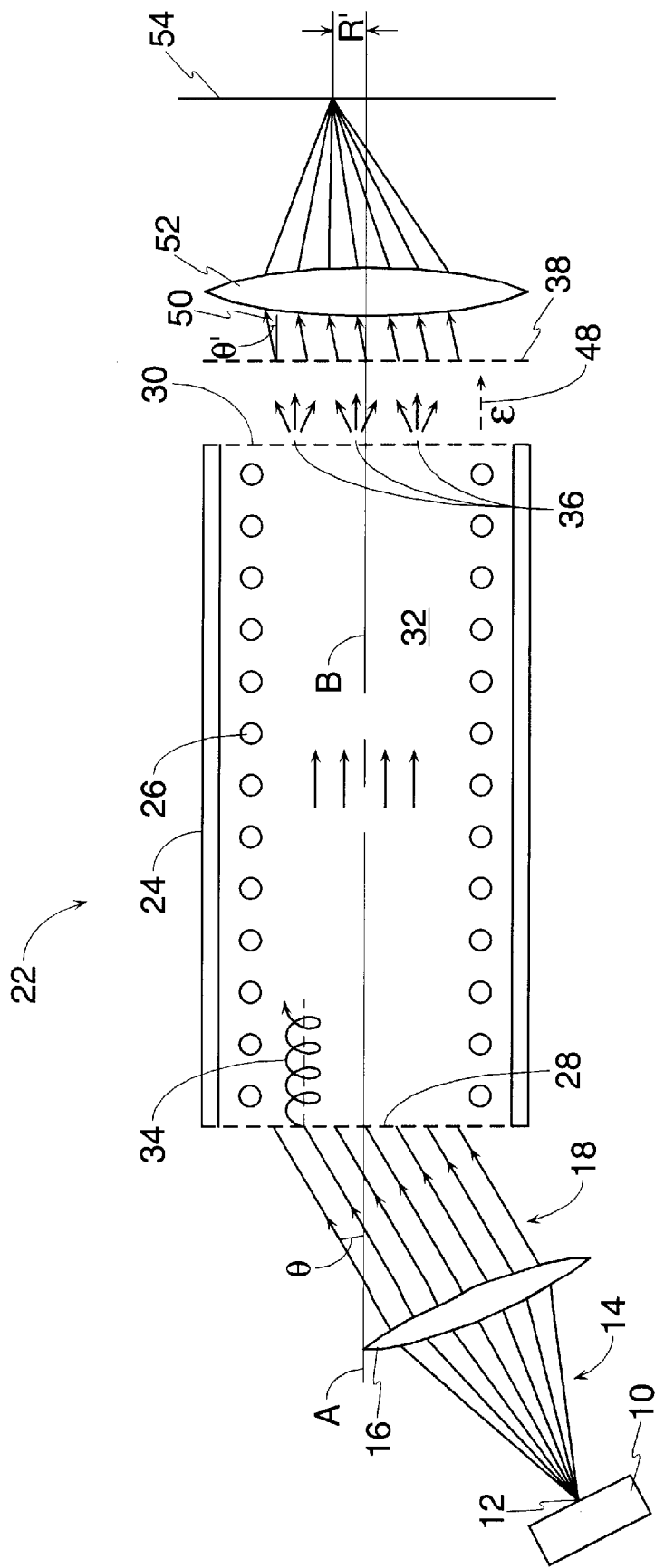
FIG. 1 is a schematic side view of an electron analyzer utilizing a uniform magnetic field.
Figure 2:
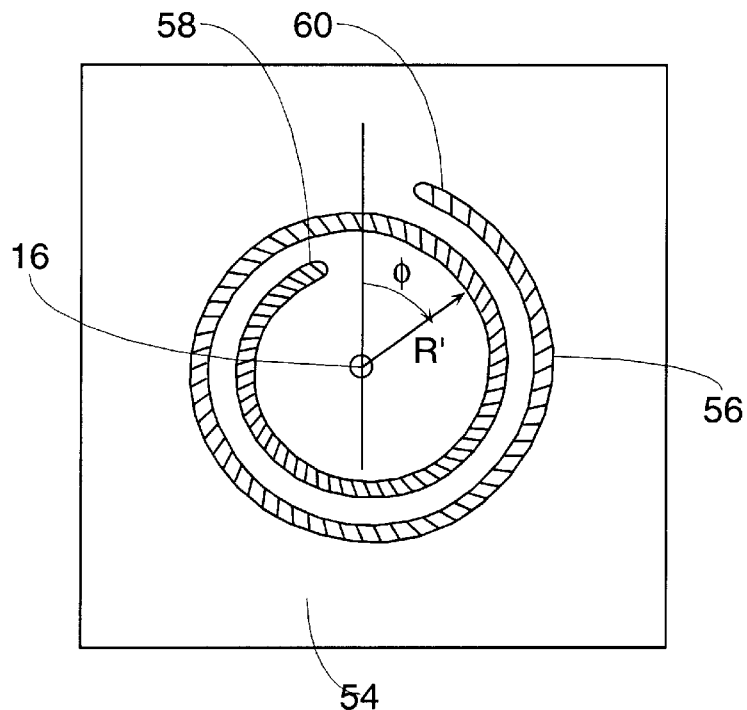
FIG. 2 is a plan view of the pattern which the electrons form on the detector plane.

I have observed that the requirement of a uniform magnetic field is unnecessarily restrictive, and that the analyzer of FIG. 1 can be simplified if non-uniform magnetic fields are allowed. Equation (1) can be viewed as in terms of the scalar magnetic potential $\Phi_M$ defined by $$\vec{B} = \nabla \Phi_M, \quad (3)$$

the integral of which is $$\Phi_M = \int \vec{B} \cdot d\vec{s}. \quad (4)$$

For the analyzer of FIG. 1, the integral is taken along the magnetic field line around which the electrons gyrate, and constant scalar magnetic potentials $\Phi_{M,1}$, $\Phi_{M,2}$ are set at the magnetically field terminating entrance and exit meshes 28, 30. For a uniform magnetic field, the integral of Equation (4) is equal to B·d, as in Equation (1). However, Equation (1) is a special case of a more general equation $$\phi = \frac{\sqrt{2}\,e}{\sqrt{Em}} \cos\theta \int_0^d \vec{B} \cdot d\vec{s}. \quad (5)$$

The electrons follow the magnetic field lines as long as the curvature of the magnetic field is much less than that of the rotating electrons.

This observation implies that it is not necessary to install a flat magnetic field terminator at the ends of the magnetic-field region. A curved magnetic field terminator still establishes a constant scalar magnetic potential $\Phi_M$ across its surface. Further, a curved magnetically field terminating grid may be used for other purposes. A curved magnetic field terminator acts as a magnetic lens. The magnetic field B on one side of the terminator is caused to be incident upon the field terminator along a normal to the local terminator surface. As before, the terminator prevents a magnetic field on one side of the terminator from passing through to the other side. An electron incident upon the field-free side of the terminator is captured by the magnetic field on the other side as long as its radius of gyration about the magnetic field line is substantially less than the curvature of the field line.

Figure 3:
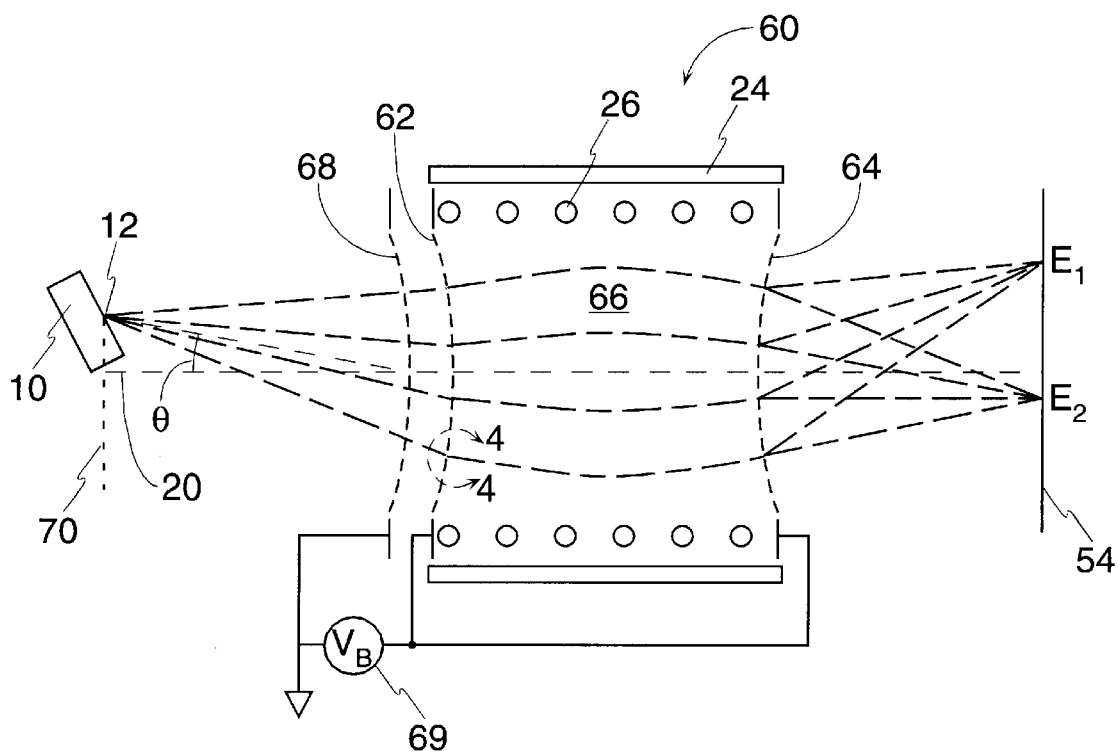
FIG. 3 is a schematic side view of an electron analyzer utilizing a non-uniform magnetic field.
Figure 4:
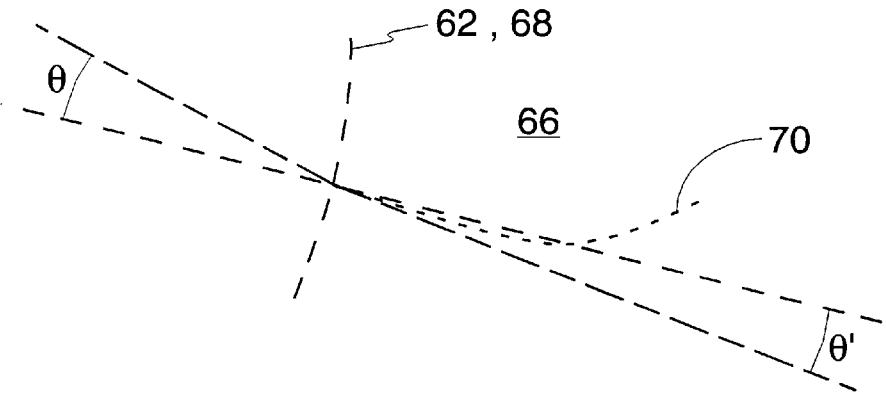
FIG. 4 is an exploded view of a portion 4—4 of the view of FIG. 3.

An embodiment of an analyzer of the invention is illustrated in schematic cross section in FIG. 3. An energy separator 60 is similar to that of FIG. 1 except that its magnetically field terminating entrance and exit meshes 62, 64 are formed into convex oblate spheroidal shapes with respect to the interior of the tube 24, that is, with respect to a magnetic region 66 in which the electrons gyrate about the lines of the non-uniform magnetic field B. Spaced apart from the entrance mesh 62 toward the sample 10 by a fixed distance is an electrostatic mesh 68. A DC power supply 69 biases the entrance mesh 62 with respect to the electrostatic mesh 68 by $V_B$, thus forming a uniform electric field between the two meshes 62, 68, taking into account the curvatures of the meshes. Thereby, electrons ejected from the sample 10 are accelerated or decelerated dependent upon the bias voltage $V_B$. Although the electrostatic grid 66 is located at a different position than in FIG. 1, the combination of the electrostatic grid 68 and the entrance mesh 62 as illustrated in the exploded view of FIG. 4, similarly causes the electrons incident upon the entrance mesh 66 to have their incident angle changed from θ to θ'. Similarly to the effect shown by Equation (2), the value of θ' depends upon the energy E of the particle. After the electrons enter the drift region 68, the diverging magnetic field causes the electrons to gyrate around a curving path 70. The magnetically permeable entrance mesh 62 thus acts as a magnetic lens, preferably having a focal plane 70 normal to the central axis 68 and passing through the sampling point 12.

The particle then follows the curved magnetic field lines in the drift region 66 and gyrates around them with a pitch angle θ'. The accumulated rotation Φ, similarly to that described by Equation (5), depends upon the particle's energy E. The particle exits the drift region 66 through the exit mesh 64, which has a curved shape, preferably in the shape of an oblate spheroid having a smaller axial radius than a transverse radius, thereby reducing coma. That is, the exit mesh 64 acts as a magnetic lens to focus the beams on the detector plane 54. As illustrated, the lens acts to separate the particle beams along the detector plane according to their energies $E_1$, $E_2$, etc.

The optics associated with the entrance and exit meshes can be modified and improved. It is recognized that a better shape for the entrance mesh is an aspheric surface of revolution about the source point such that it allows all particles from the source to enter the magnetic field at the same angle relative to the magnetic field lines, which are assumed to terminate normally at the mesh surface. According to this formulation, the shape would satisfy the differential equation $$\frac{dx}{dy} = \tan\left(\theta + \tan^{-1}\frac{y}{x}\right), \tag{6}$$

where x and y are the coordinates of the mesh relative to the source point.

The length of the drift region 66 relative to its diameter as well as the strength of the magnetic field in the drift region can be varied to provide various combinations of a wide energy window, a high energy resolution, and a high particle sensitivity.

Figure 5:
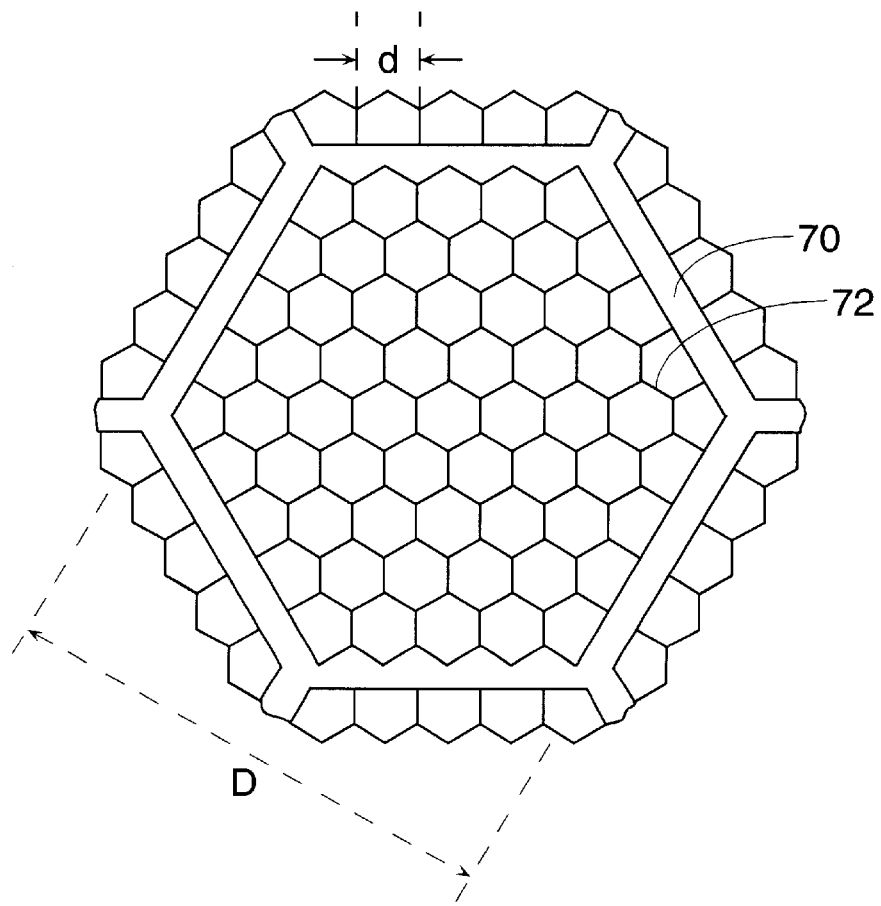
FIG. 5 is a plan view of a magnetic mesh usable with the analyzer of the invention.

The fabrication of the magnetic meshes presents one of the more challenging engineering jobs. Magnetic meshes are described only occasionally within the literature, e.g., by Kim et al. in "Construction of a new imaging bandpass analyzer for a magnetic projection photoelectron microscope," *Review of Scientific Instruments*, vol. 65, no. 5, May 1993, pp. 3159–3167. The permeability of the mesh material should be high, preferably above 300, and some materials are available with permanences of 30,000 and above. However, the saturation field should also be high. Further, such a mesh should satisfy two conflicting requirements, substantial net magnetic permanence and high electron transparency. The first requirement suggests a thick, dense mesh, while the second suggests a thin, light mesh. One possible design which combines these two requirements is illustrated in FIG. 5 and includes a coarse hexagonal mesh with a cell size of D and having large ribs 70 of cross-sectional dimensions H and W for the height and width of the ribs 70 and a fine hexagonal mesh with a cell size of d included in each of the apertures of the heavy mesh, where D>>d. The light mesh has small ribs 72 of cross sectional dimensions h and w for their height and width, where H>>h and W>>w. Fine, non-planar meshes made of magnetic material are available commercially from Elcon, Inc. of San Jose, Calif.

The additional energy may be added to the charged particles by an electrostatic mesh positioned after the exit mesh, as in FIG. 1, or before the entrance mesh, as in FIG. 3. Alternatively, the separate electrostatic mesh may be eliminated by applying the biasing source 69 across the entrance and exit meshes 62, 64. In the latter embodiment, an electric field extends across the drift region 66, producing more complex trajectories, but the functional results are the same. All these embodiments conform to the dispersion means of the claims of my prior patent.

Although the invention can be most easily applied to an electron analyzer because of the relatively light electronic mass, with proper scaling the analyzer can be adapted to analyze the energies of other charged particles, such as atomic ions or charged molecules.

The magnetic field in the described embodiments is generated by a solenoidal coil powered by a DC power supply. Alternative means are available for generating the magnetic field, such as permanent magnets, particularly a tubular magnet of axial polarization.

Various types of detectors are available, including fluorescent screens, charged-coupled detector arrays, and photorecording media, such as photographic film.

The described embodiments have included a straight central particle axis. It is well understood in the art that a central axis for charged particles can be bent by magnets or electrical means.

A more general description of the invention is that, at some surface of a magnetic field having a constant scalar magnetic potential, charged particles such as electrons distributed across that surface are caused to have their momenta offset at substantially the same angle from the magnetic field lines. Electrons of different energies, in gyrating about the magnetic field lines, will accumulate different amounts of rotation. On the detecting end, the amounts of rotation are determined, thus determining the electrons' energies.

The invention thus provides a simple but very useful dynamic energy analyzer for charged particles. The elimination of the requirement for uniform magnetic field allows the meshes to be curved to serve other purposes such as magnetic lenses, thereby reducing the number of components in the system.

What is claimed is:

1. A charged particle energy analyzer, comprising:

means for creating a magnetic field within a region and defining a cross section and a length, a direction of the magnetic field extending at least partially along the length thereof;

injection means for inserting a flux of charged particles having different energies and traveling in entrance trajectories into the magnetic field so that charged particles travel along helical trajectories rotating about magnetic field lines, the magnetic field having a strength sufficient to cause the helical trajectories of the charged particles to be contained within the cross section of the magnetic field; and measuring means for determining a total rotation of each charged particle after traveling a distance along a principal direction of the magnetic field, the measuring means relating the total rotation to the energy of the particle.

2. The analyzer of claim 1, wherein said magnetic field is curved within said region.

3. The analyzer of claim 1, further comprising curved entrance field termination means through which said charged particles pass in entering said region.

4. The analyzer of claim 3, wherein said curved inlet field termination means have a focus associated with a source of said flux of charged particles.

5. The analyzer of claim 1, further comprising curved exit field termination means through which said charged particles pass in exiting said region.

6. A charged particle energy analyzer, comprising:

means for creating a magnetic field in a region having a defined cross section and a length, the direction of the magnetic field being generally along the length thereof;

injecting means for inserting a flux of charged particles having different energies into the magnetic field at a magnetic equipotential so that particles of a same energy enter at substantially a same angle to the field lines at that equipotential and subsequently travel in helical paths along the magnetic field lines, the magnetic field having a strength sufficient to cause the helical trajectories of the charged particles to be contained within the cross section of the magnetic field; and measuring means for determining the total rotation of each charged particle after traveling along the field lines to a second magnetic equipotential, the measuring means being capable of relating the total rotation to the energy of the particle.

7. The analyzer of claim 6, wherein the magnetic equipotentials are defined by magnetic poles made of meshes composed of magnetically field terminating material through which the incident charged particles can pass.

8. The analyzer of claim 7, wherein the mesh through which the charged particles are injected is shaped in such a way that particles emanating from a point source all enter the magnetic field at substantially a given angle to the magnetic field lines.

9. The analyzer of claim 7, wherein the charged particles exit through a second mesh shaped so that particles of a given energy are focused to a point in the measuring plane.

10. The analyzer of claim 7, wherein a voltage is applied between the two meshes to accelerate or retard the charged particles.

11. The analyzer of claim 7, further comprising an electrically conductive mesh positioned outside of the other two meshes to accelerate or retard the charged particles.

12. The analyzer of claim 6, wherein the creating means comprises an electromagnet generating said magnetic field.

13. The analyzer of claim 6, wherein said creating means comprises a permanent magnet generating said magnetic field.

14. The analyzer of claim 6, wherein said flux of charged particles emanates from a source offset from a central axis of said region.

15. A charged particle energy analyzer, comprising:
- a magnetic field generator producing a generally axial magnetic field along a central axis extending through in a drift region;
- a first magnetically field terminating mesh disposed on a first side of said drift region;
- a second magnetically field terminating mesh disposed on a second side of said drift region;
- a source of charged particles disposed outside of said first mesh from said drift region at a position offset by an angle with respect to said central axis at said first mesh; and
- a multi-positional particle detector disposed outside of said second mesh from said drift region in a surface extending across said central axis.

16. The analyzer of claim 15, wherein said first and second meshes are substantially flat to produce a substantially uniform magnetic field in said drift region.

17. The analyzer of claim 15, wherein at least one of said first and second meshes are curved to produce a non-uniform magnetic field in said drift region.

18. The analyzer of claim 17, wherein said first mesh is curved in a first shape concave relative to an exterior of said drift region.

19. The analyzer of claim 18, wherein said first shape focuses a source of said charged particles.

20. The analyzer of claim 17, wherein said second mesh is curved in a second shape concave relative to an exterior of said drift region.

21. The analyzer of claim 20, wherein said second shape focuses said particles onto said detector.

22. The analyzer of claim 15, further comprising a grid disposed to an outside of said first mesh electrically biasable with respect to said first mesh.

23. The analyzer of claim 15, further comprising a grid disposed to an outside of said second mesh electrically biasable with respect to said second mesh.

24. The analyzer of claim 15, further comprising an electrical biasing source biasing said first mesh with respect to said second mesh.

25. The analyzer of claim 15, wherein said magnetically field terminating meshes comprise a magnetically field terminating material and further comprising a magnetically field terminating body surrounding sides of said magnetic field region and forming a magnetic circuit with said first and second magnetically field terminating meshes.

26. A method of analyzing an energy of a beam of electrons, comprising the steps of:
- at a surface of equal scalar magnetic potential in a region of magnetic field, causing said electrons to have momenta offset from lines of said magnetic field by predetermined angles, whereby said electrons gyrate about said lines of said magnetic field;
- drifting said electrons across said region of magnetic field, whereby electrons of differing energies accumulate differing amounts of rotation; and
- at a measuring site, determining said amounts of rotation.

27. The method of claim 26, wherein said surface is curved.

28. The method of claim 27, wherein a magnetically field terminating mesh is placed at said surface with a focus of said surface associated with a source of said beam of electrons.

29. A curved magnetic mesh forming a magnetic lens which terminates an externally generated magnetic field, the mesh comprising intersecting ribs of a magnetically field terminating material having a permanence of at least 300 and forming apertures between said ribs, said mesh being formed into a predetermined doubly curved shape.

30. The mesh of claim 29, wherein said mesh comprises:
- a coarse mesh comprising coarse ribs and having coarse apertures therebetween; and
- a fine mesh comprising fine ribs formed in said coarse apertures and having fine aperture therebetween, a cross section of said fine ribs being smaller than a cross section of said coarse ribs.

* * * * *

UNITED STATES PATENT AND TRADEMARK OFFICE
CERTIFICATE OF CORRECTION

PATENT NO. : 5,969,354

DATED : October 19, 1999

INVENTOR(S) : Michael A. Kelly

It is certified that error appears in the above-identified patent and that said Letters Patent is hereby corrected as shown below:

Column 1, line 46, change "20" to --A--.

Column 2, line 13, change "32" to --34--.

Column 2, line 37, change "40" to --48--.

Column 2, line 52, change "20" to --A--.

Column 4, line 38, after "θ'" insert --with respect to an axis 20--.

Signed and Sealed this

Twentieth Day of June, 2000

Attest:

Q. TODD DICKINSON

*Attesting Officer*  *Director of Patents and Trademarks*